United States Patent [19]

Lewis et al.

[11] Patent Number: 4,970,137
[45] Date of Patent: Nov. 13, 1990

[54] PROCESS FOR SENSITIZING POLYACETYLENIC FILMS

[75] Inventors: David F. Lewis, Monroe, Conn.; Steward E. Purdy, Binghamton, N.Y.

[73] Assignee: GAF Chemicals Corporation, Wayne, N.J.

[21] Appl. No.: 321,136

[22] Filed: Mar. 9, 1989

[51] Int. Cl.$^5$ .......................... G03F 7/025; B05D 3/10
[52] U.S. Cl. ...................... 430/296; 430/271; 430/281; 430/333; 430/346; 526/285; 427/283
[58] Field of Search ............... 430/281, 270, 296, 333, 430/271, 346; 522/87, 183; 526/285; 427/283

[56] References Cited

U.S. PATENT DOCUMENTS

| | | | |
|---|---|---|---|
| 3,594,175 | 7/1971 | Hay | 430/270 |
| 3,594,175 | 7/1971 | Hay | 430/270 |
| 3,871,885 | 3/1975 | Hertler | 430/281 |
| 3,871,885 | 3/1975 | Hertler | 430/281 |
| 4,215,208 | 7/1980 | Yee et al. | 526/285 |
| 4,220,747 | 9/1980 | Preziosi et al. | 526/285 |
| 4,220,747 | 9/1980 | Preziosi et al. | 526/285 |
| 4,384,980 | 5/1983 | Patel | 427/283 |
| 4,439,514 | 3/1984 | Garito | 430/270 |
| 4,562,141 | 12/1985 | Tieke | 430/281 |
| 4,615,962 | 10/1986 | Garito | 430/270 |
| 4,649,100 | 3/1987 | Leyer et al. | 430/330 |
| 4,649,100 | 3/1987 | Leyer et al. | 430/330 |
| 4,705,742 | 11/1987 | Lewis | 430/296 |
| 4,734,355 | 3/1988 | Lewis et al. | 430/270 |
| 4,784,934 | 11/1988 | Lewis et al. | 430/270 |
| 4,830,952 | 5/1989 | Penner et al. | 430/281 |

FOREIGN PATENT DOCUMENTS 61-105542 5/1986 Japan .................. 430/270

Primary Examiner—Marion C. McCamish
Assistant Examiner—Christopher D. RoDee
Attorney, Agent, or Firm—Marilyn J. Maue; Joshua J. Ward

[57] ABSTRACT

This invention concerns a process of mixing a dispersion comprising a substantially crystalline, image receptive polyacetylenic compound in an aqueous non-solvating binder solutions with an effective ripening amount of an organic liquid boiling above 30° C. which is completely miscible with water at least in a proportion of 1:2 part per parts and in which said polyacetylene is soluble for a time and at an elevated temperature sufficient to effect crystalline growth and improved sensitivity to imaging by exposure to a source of radiation.

14 Claims, No Drawings

PROCESS FOR SENSITIZING POLYACETYLENIC FILMS

In one aspect, the invention relates to a process for improving the sensitivity of image receptive polyacetylenic dispersions.

In another aspect the invention relates to the product of the process and to its uses in various applications involving image receptive films.

BACKGROUND OF THE INVENTION

Various photosensitive polyacetylenic compounds their dispersions in binder and methods of exposure have been disclosed in several patents including U.S. Pat. Nos. 4,066,676; 4,581,315; 3,501,302; 3,772,027 and 3,954,816. All of these imaging systems require the use of radiation sensitive polyacetylenic crystals uniformly and fixedly dispersed in an aqueous binder which forms a layer on a film substrate. The recording of image information on many polyacetylenic films has presented several problems and shortcomings, such as an inadequate degree of resolution, limitations related to certain sources of radiation for adequate exposure, inferior image color density and color instability. Other deficiencies include a relatively slow development of the image and, in certain cases, the need for imaging at extremely low temperatures in order to maintain receptivity of the polyacetylenic compound. Among the more sensitive polyacetylenic compounds which respond to development on exposure to radiation from many sources are the conjugated diacetylenes containing a hydrophilic group which promotes hydrogen bonding so that polyacetylene in adjacent molecules can be properly aligned for polymeriation.

It has been found however that, even among these species, the degree of sensitivity varies widely so that some have a relatively low radiation sensitivity which is best imaged in the short wavelength portion of the spectrum. Others exhibit a higher sensitivity toward the desired longer wavelength portions. Regardless of the species selected for imaging, it is always desirable to maximize sensitivity so as to achieve one or more benefits which include increasing the speed of response to exposure, the ability to employ lower dosages and expanding the wavelength sensitivity of polyacetylenic films.

Accordingly, it is an object of this invention to achieve the above benefits by an economical and commercially feasible process.

Another object is to provide a product which has markedly improved image receptivity.

Still another object is to provide a new and unique polyacetylenic crystalline composition disposed in a suitable binder.

These and other objects of the invention will become apparent from the following description and disclosure.

THE INVENTION

According to this invention, there is provided a process for improving radiant imaging sensitivity of a dispersion comprising an image receptive polyacetylenic compound in a non-solvating aqueous binder solution by contacting the dispersion with an effective ripening amount of an organic liquid having a boiling point above 30° C. which liquid is miscible with water at least in a proportion of 1:2 part per parts or more of water and in which said polyacetylene is soluble. The dispersion and organic liquid ripener are mixed for a time and at a temperature sufficient to effect crystalline growth and to improve sensitivity of the polyacetylenic dispersion.

The ripened films of this invention are receptive to imaging by exposure to any source of radiation energy, including exposure to UV light, an electron beam, gamma rays, X-rays, $\beta$-rays, electron corona discharge, neutrons, $\alpha$-particles, etc.

The crystalline polyacetylenic dispersions which are treated by the process of this invention can be obtained by blending the image receptive polyacetylenic compound dissolved in a solvent, which is immiscible or only partially miscible in water, with an aqueous binder solution which is non-solvating with respect to the polyacetylene. The concentration of polyacetylenic crystals to water in the binder solution is generally between about 1:1 to about 1:1000, preferably between about 1:5 and about 1:100 part/parts and the weight ratio of polyacetylenic compound to binder is in a weight ratio of from about 1:10 to about 3:1. Suitable solvents for the polyacetylenic compound include n-butanol, hexanol, octanol, ethyl acetate, cyclohexanone, cyclohexane, benzene, toluene, phenol and others which are insoluble or slightly soluble in water. Suitable water soluble non-solvating binders include photographic gelatin, dextran, polyvinyl alcohol, vinyl acetate, polyvinylpyrrolidone, hydrophilic cellulose and mixtures thereof.

The aqueous binder and the polyacetylenic solution are blended at an elevated temperature between about 40° and about 100° C. but below the boiling point of the polyacetylene solvent. The resulting blended product is an emulsion comprising discrete globules of dissolved Polyacetylenic compound which are insoluble in the continuous aqueous binder phase but which are uniformly dispersed in the binder solution. The emulsion can be then cooled below about 35° C. to initiate crystallization of the polyacetylene in solvent, after which the dispersion is dried at a temperature sufficient to remove the solvent and complete crystallization of the polyacetylenic component. Often, solvent removal may not effect 100% crystalization so that the dispersion contains a minor amount of the polyacetylenic component in an amorphous form. This may result from rapid chilling during processing.

According to this method, the polyacetylenic compound is contacted with the solvent in a weight ratio of between about 1:1 and about 1:10 and the resulting solution is blended with the binder solution over a period of from about 10 seconds to about 30 minutes.

Other methods for preparing instant polyacetylene dispersions can also be employed. These would include the condensation of the polyacetylene from the vapor phase into an aqueous binder solution; the precipitation of a polyacetylene having a carboxyl functionality from an aqueous binder solution and grinding a solid polyacetylenic compound to desired crystalline size in a sand mill containing aqueous binder solution.

In accordance with the present invention a solvent free, substantially crystalline polyacetylenic dispersion is treated with the ripening agent of the present invention. Suitable ripening agents are liquids boiling above 30° C. in which the polyacetylenic compound is soluble and which are miscible with water in all proportions under the conditions of treatment. Particularly preferred ripening agents are liquid, oxygen-containing hydrocarbons which include $C_1$ to $C_3$ alcohols, e.g.

methanol, ethanol and propanol; butanediol, hexanediol, propargyl alcohol, hexamethylene glycol; ketones, e.g. acetone, methylethyl ketone, diethyl ketone; aldehydes, e.g. acetaldehyde, benzaldehyde and amides, e.g. N-methylpyrrolidone. Other suitable ripening agents include amines e.g. methyl n-propyl amine, 2-methylpiperidine, piperidine, picoline, and other compounds which have high or unlimited miscibility with water. Accordingly, the preferred ripening agents of this invention are those organic liquids having from 1 to 10 carbon atoms and a boiling point sufficient to maintain a liquid phase during contacting. Most preferred are methanol, ethanol, acetone and methylethyl ketone. The ripening agents are preferably employed without dilution i.e. as pure compounds or mixtures thereof; although aqueous solutions containing at least 10% ripener can be employed when more dilute dispersion products are desired. Also, mixtures of preferred and non-preferred ripening agents can be used in the present process.

The ripening agent is mixed with the polyacetylenic dispersion at below its boiling point, e.g. at a temperature of from about 30° C. to below 100° C. under atmospheric pressure. Higher temperatures and higher boiling organic ripening agents can be employed in pressurized systems. The ripener is intimately mixed with the dispersion for a period of from about 5 minutes to about 10 hours, preferably from about 30 minutes to 5 hours. The mole ratio of ripener to water in the dispersion is maintained between about 1:2 and about 1:100, preferably between about 1:5 and about 1:20.

The ripening operation permits growth of the polyacetylenic crystals in a substantially uniform orientation to a larger average particle size. Also, during the ripening treatment, any amorphous polyacetylenic compound is converted to crystalline form. The resulting product containing polyacetylenic crystals dispersed in the aqueous ripening agent and uniformly and fixedly dispersed in the binder can be directly applied to a substrate for use as an image receptive film. Alternatively, the ripened product dispersion can be cooled to solidification and stored for subsequent use. If desired the usual wetting agents can be added to the ripened dispersion before applying the composition to the film base. The dispersion composition of this invention contains ripening agent which is not removed from the system before coating on a substrate or subsequent imaging.

The dispersed polyacetylenic compounds treated herein are polyacetylenes containing a hydrophilic group such as groups which promote hydrogen bonding so that the polyacetylene in adjacent molecules can be properly aligned for desired polymerization during imaging. Accordingly, the polyacetylenic compounds include those substituted with amino, amido, hydroxy, ester, phenol carboxyl, halo, sulfonyl, sulfoxyl, sulfinyl, silyl, siloxy, phosphoro, phosphate, ketone, aldehyde and urethane groups. In addition, metal salt or ammonium salt modifications of any of the foregoing may be employed. Particularly desirable are the conjugated diacetylenes substituted with an amino or carboxylic group or the metalized salt or ammonium salt thereof. Suitable polyacetylenes are described in U.S. Pat. Nos. 4,734,355; 4,066,676; 3,772,027 and 3,501,302, incorporated herein by reference.

Suitable binder materials in which the polyacetylenic crystals are fixedly positioned include any of those disclosed in the aforementioned patents. Most preferred of these is photographic gelatin.

The ripening treatment of this invention provides many benefits in the resulting polyacetylenic dispersions such as a marked increase in radiation sensitivity, increased color density, increased speed of imaging and sensitization of dispersions which are normally limited to UV light exposure or those which require prohibitively long exposures to other types of radiation such as gamma rays, electron beam, X-rays, beta-rays, electron corona discharge, etc. However, it is to be understood that the ripening process of this invention applies to all dispersions of image receptive polyacetylene crystals, even those of highest sensitivity, to effect improvements therein.

Having thus generally described the invention, reference is now had to the accompanying examples which represent preferred embodiments but which are not to be construed as limiting to the scope of the invention as is more broadly set forth in the foregoing disclosure and in the appended claims.

EXAMPLE 1

A. Preparation of Basic Dispersion

In a glass beaker, 15 g of pentacosa-10,12-diynoic acid was dissolved at 38° C. in 45 g of ethyl acetate to form a solution. (Solution V). A second solution. (Solution W), was prepared by dissolving 15 g of photographic gelatin in 250 g of water and 30 ml of an aqueous solution containing 2.5% by weight of an acid ester surfactant, GAFAC RS-710.

Solution W was heated to 40° C. and introduced into a one quart size Waring blender. While blending at high speed, Solution V was added to Solution W over about a 30 second period. Blending was continued for an additional 2-5 minutes before pouring into a stainless steel tray where it was allowed to chill set and the gelled dispersion was cut into approximately 1 cm cubes and exposed to an airstream for removal of ethyl acetate by evaporation. After the ethyl acetate had been removed, the dispersion was frozen at about −15° C. for 2 days and then allowed to warm to room temperature after which it was melted at 40° C. and sufficient water added to replace the liquids lost during the drying step in which the ethyl acetate was removed. At this stage, the dispersion was coated on a film base.

B. Basic Ripeninq Procedure and Ripened Dispersion

A frozen, water reconstituted sample of the dispersion of Example 1A from which ethyl acetate had been removed, was melted, with stirring, in a glass beaker and heated to 50° C. whereupon 90 ml of methanol/Kg of dispersion was slowly added over a period of about 2.5 minutes.

The dispersion with the methanol was covered and maintained at 50° C. with good agitation for 2 hours after which the ripened dispersion was immediately coated on a film base.

EXAMPLE 2

Sensitivity of Ripened and Non-Ripened Dispersions

With the addition of a small quantity (0.5%) of coating aid, the dispersion of Example 1A was coated to about 5 um thickness on a conductive, 4 mil, polyester substrate to provide Coating A. In a like manner, the ripened dispersion of Example 1B was coated in similar thickness on the polyester substrate to provide Coating B.

Coatings A and B were exposed to a 15 keV electron beam. The exposure patterns consisted of a series of sixteen steps, each approximately 6 mm x 6 mm, exposed at increasing dosages between about $5 \times 10^{-9}$ C/cm$^2$ and $2.5 \times 10^{-6}$ C/cm$^2$ By measuring the visual density of the blue images so produced, it was possible to determine the exposure dosage required to produce an image with a visual density of 2.0. It was found that the exposure required to produce an image of this density on Coating B was about 50% of that required to produce a like density on Coating A. In summary, the ripening process produced an image receptive dispersion having about twice the sensitivity of the unripened dispersion of Coating A.

EXAMPLE 3

A. In a glass beaker, 372 g of pentacosa-10,12-diynoic acid was dissolved in 372 g of n-butanol at about 55° C. and filtered to form Solution X. Solution Y was prepared by dissolving 372 g of photographic gelatin and 15 g of a standard dispersing aid, Alkanol-XC, in 6.5 liters of water. Solution Y was heated to 75° C. and Solution X, at about 55° C., was added with vigorous mixing over about a 2 minute period. After the addition was complete, the agitation was continued for an additional 2 minutes at which time the dispersion of Solution X in Solution Y was poured into stainless steel pans and chill set.

The dispersion was shredded into cubes about 1 cm in size and placed into an airstream for several hours whereby the bulk of the n-butanol was evaporated. The dispersion was then reconstituted by melting at about 40° C. with the addition of sufficient water to replace the evaporated liquids, i.e. water and n-butanol. The reconstituted dispersion was once more chill set and then frozen at about −15° C. for 48 hours. The frozen dispersion, after thawing, was employed as a radiation sensitive coating (Coating C) in 5 um thickness on a conductive polyester film.

B. A portion of the dispersion of Example 3A after removing n-butanol, freezing and reconstituting was melted at 50° C. and ripened with the addition of 90 ml of ethanol/kilogram of dispersion. Samples of the dispersion were taken after various time intervals and coated to about 5 um thickness on a conductive polyester film base. These coatings were then exposed to a 15 keV electron beam and the dosage required to produce an image with a visual density of 2.0 was determined. As can be seen from the following Table I, the ripening process produces significant progressive increases in sensitivity over a ripening period of 2 hours.

TABLE I

| DISPERSION TESTED | SENSITIVITY, C/cm$^2$ × 10$^{-7}$ |
| --- | --- |
| Coating C | 2.32 |
| Coating of 3B after 60 min. | 1.40 |
| Coating of 3B after 120 min. | 1.19 |
| Coating of 3B after 240 min. | 1.19 |

EXAMPLE 4

Portions of the dispersion used to produce Coating C of Example 3A were melted and ripened with the addition of 90 ml of methanol/kg of dispersion. These experiments were conducted at temperatures of 40° C., 50° C. and 60° C. Samples of the dispersion were taken after various time intervals and coated to about 5 um thickness on a conductive polyester film base. These coatings were then exposed to a 15 KeV electron beam and the dosage required to produce an image with a visual density of 2.0 was determined. As can be seen from Table II, the ripening process produces significant progressive increases in sensitivity over a ripening period of at least 4 hours.

TABLE II

| | Sensitivity, C/cm$^2$ × 10$^{-7}$ Temperature, °C. | | |
| --- | --- | --- | --- |
| DISPERSION TESTED | 40 | 50 | 60 |
| Coating C of Example 3A | 2.32 | 2.32 | 2.32 |
| Coating of Example 4 after 60 min. | 2.07 | 1.53 | 1.57 |
| Coating of Example 4 after 120 min. | 1.93 | 1.44 | — |
| Coating of Example 4 after 240 min. | 1.73 | 1.27 | 1.13 |

The data further indicate that the ripening progresses at substantially the same rate at 50° C. and 60° C., but significantly slower rate at 40° C.

What is claimed is:

1. A thermal process which comprises adding to the aqueous phase of a composition comprising a photosensitive, microcrystalline polyacetylene compound dispersed in a non-solvating aqueous binder solution, an effective ripening amount of an organic liquid having from 1 to 10 carbon atoms and having a boiling point above 30° C., which liquid is completely miscible with water and digesting the dispersed polyacetylene microcrystals in the resulting aqueous solution in which the polyacetylene compound is substantially insoluble, at an elevated temperature for a period of from about 5 minutes to 10 hours.

2. The process of claim 1 wherein said liquid is a compound selected from the group consisting of an alcohol, a ketone, an aldehyde, an amine and an amide or a mixture thereof.

3. The process of claim 2 wherein said liquid is methanol, ethanol, propanol, methyl ethyl ketone or acetone.

4. The process of claim 1 wherein said organic liquid is added at a temperature of from about 30° C. to below 100 C.

5. The process of claim 4 wherein the mole ratio of said organic liquid to water in the dispersion is between about 1:2 and about 1:100.

6. The process of claim 5 wherein said ratio is between about 1:5 and about 1:20.

7. The process of claim 1 wherein said polyacetylenic compound is a conjugated diacetylenic compound.

8. The process of claim 7 wherein said polyacetylenic compound is pentacosa-10,12-diynoic acid.

9. The product of the process of claim 1.

10. The product of the process of claim 3.

11. The process of coating an effective imageable amount of the product of claim 9 on a conductive substrate and exposing said coated substrate to a source of radiation for imaging.

12. The process of claim 11 wherein said source of radiation is selected from the group of an electron beam, X-rays, gamma rays and ultraviolet light.

13. An imageable film coated with the product of the process of claim 9.

14. An imageable film coated with the product of the process of claim 10.

* * * * *